(12) United States Patent
Park et al.

(10) Patent No.: US 11,515,247 B2
(45) Date of Patent: Nov. 29, 2022

(54) CAPACITANCE FINE TUNING BY FIN CAPACITOR DESIGN

(71) Applicant: QUALCOMM Incorporated, San Diego, CA (US)

(72) Inventors: Nosun Park, Incheon (KR); Changhan Hobie Yun, San Diego, CA (US); Daniel Daeik Kim, San Diego, CA (US); Sameer Sunil Vadhavkar, San Diego, CA (US); Paragkumar Ajaybhai Thadesar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 88 days.

(21) Appl. No.: 17/149,006

(22) Filed: Jan. 14, 2021

(65) Prior Publication Data
US 2022/0223516 A1    Jul. 14, 2022

(51) Int. Cl.
*H01L 23/52*    (2006.01)
*H01L 23/522*    (2006.01)
*H01L 21/70*    (2006.01)
*H01L 27/01*    (2006.01)

(52) U.S. Cl.
CPC ........ *H01L 23/5223* (2013.01); *H01L 21/702* (2013.01); *H01L 27/01* (2013.01); *H01L 23/5226* (2013.01)

(58) Field of Classification Search
CPC ... H01L 23/5223; H01L 21/702; H01L 27/01; H01L 23/5226; H01L 28/60; H01L 27/0805; H01L 28/88
See application file for complete search history.

(56) References Cited

U.S. PATENT DOCUMENTS

| 5,717,236 | A | * | 2/1998 | Shinkawata | ............ | H01L 28/40 257/E21.59 |
| 6,285,050 | B1 | * | 9/2001 | Emma | ................. | H01L 27/0688 257/E21.009 |
| 6,407,419 | B1 | * | 6/2002 | Okudaira | .......... | H01L 27/10855 257/295 |
| 2004/0147087 | A1 | | 7/2004 | Cheng et al. | | |
| 2005/0266652 | A1 | | 12/2005 | Chudzik et al. | | |

(Continued)

OTHER PUBLICATIONS

International Search Report and Written Opinion—PCT/US2021/061266—ISA/EPO—dated Mar. 15, 2022.

*Primary Examiner* — Samuel Park
(74) *Attorney, Agent, or Firm* — Qualcomm Incorporated

(57) ABSTRACT

A device includes a main capacitor composed of a first plate of a first back-end-of-line (BEOL) metallization layer, a main insulator layer on the first plate, and a second plate on the main insulator layer. The second plate is composed of a second BEOL metallization layer. The device includes a first tuning capacitor of a first portion of a first BEOL interconnect trace coupled to the first plate of the main capacitor through first BEOL sideline traces. The first tuning capacitor is composed of a first insulator layer on a surface and sidewalls of the first portion of the first BEOL interconnect trace. The first tuning capacitor includes a second BEOL interconnect trace on a surface and sidewalls of the first insulator layer. The device includes a first via capture pad coupled to the second BEOL interconnect trace of the first tuning capacitor.

20 Claims, 11 Drawing Sheets

(56) References Cited

U.S. PATENT DOCUMENTS

| | | | |
|---|---|---|---|
| 2007/0209178 A1* | 9/2007 | Savic | H05K 1/162 |
| | | | 29/831 |
| 2011/0298554 A1* | 12/2011 | Bar | H03H 9/0542 |
| | | | 29/25.42 |
| 2015/0022938 A1* | 1/2015 | Okada | H01G 4/33 |
| | | | 361/278 |
| 2015/0200245 A1* | 7/2015 | Yun | H01L 23/5223 |
| | | | 438/398 |
| 2017/0373001 A1 | 12/2017 | Tailliet et al. | |
| 2018/0048290 A1* | 2/2018 | Sekine | H03H 9/171 |
| 2018/0054177 A1* | 2/2018 | Mudakatte | H03H 7/46 |
| 2018/0083588 A1* | 3/2018 | Yun | H04B 1/0458 |
| 2020/0006303 A1* | 1/2020 | Akiba | H01L 23/49838 |
| 2021/0118618 A1* | 4/2021 | Shin | H01G 4/236 |
| 2021/0320072 A1* | 10/2021 | Lee | H01L 23/5225 |

* cited by examiner

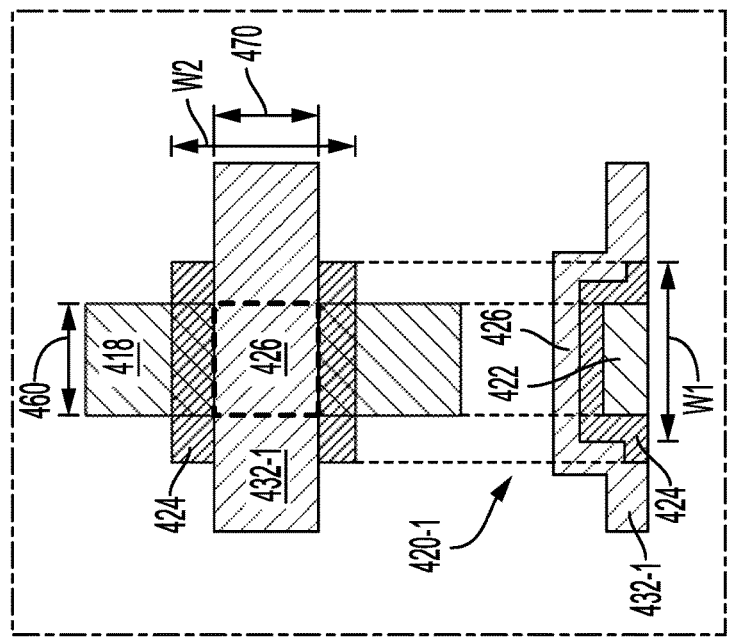
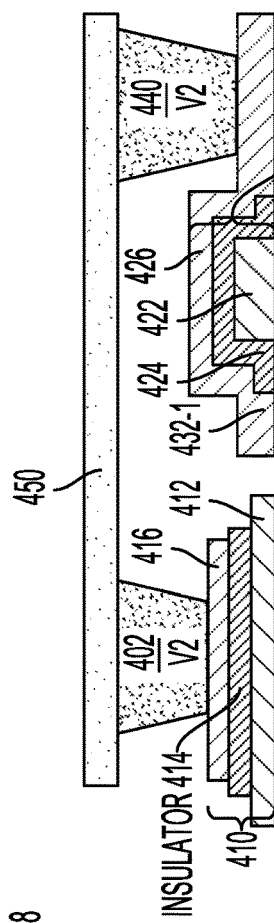
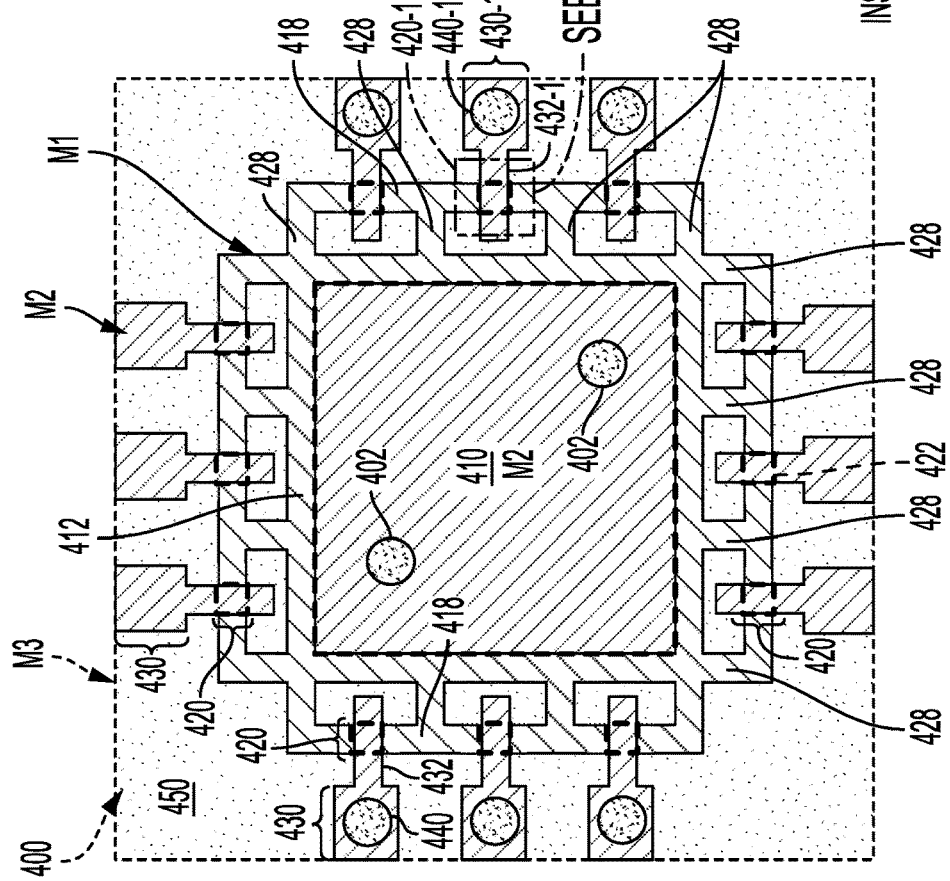
FIG. 4B
FIG. 4C
FIG. 4A

CAPACITANCE FINE TUNING BY FIN CAPACITOR DESIGN

BACKGROUND

Field

Aspects of the present disclosure relate to semiconductor devices and, more particularly, capacitance tuning using a fin capacitor design.

Background

Mobile radio frequency (RF) chips (e.g., mobile RF transceivers) have migrated to a deep sub-micron process node due to cost and power consumption considerations. Designing mobile RF transceivers is further complicated by added circuit functions for supporting communication enhancements, such as fifth generation (5G) new radio (NR) communications systems. Further design challenges for mobile RF transceivers include using passive devices, which directly affect analog/RF performance considerations, including mismatch, noise, and other performance considerations.

Passive devices may involve high performance capacitor components. For example, analog integrated circuits use various types of passive devices, such as integrated capacitors. For example, a passive device may be an integrated passive device (IPD). These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures.

The design of mobile radio frequency (RF) transceivers may include metal-insulator-metal (MIM) capacitors. Unfortunately, during operation, a capacitance value of the MIM capacitors may vary within RF products, such as RF transceivers. A tuning capacitor supporting a reduced capacitance tuning interval for high accuracy applications is desired.

SUMMARY

A device includes a main capacitor composed of a first plate of a first back-end-of-line (BEOL) metallization layer, a main insulator layer on the first plate, and a second plate on the main insulator layer. The second plate is composed of a second BEOL metallization layer. The device includes a first tuning capacitor of a first portion of a first BEOL interconnect trace coupled to the first plate of the main capacitor through first BEOL sideline traces. The first tuning capacitor is composed of a first insulator layer on a surface and sidewalls of the first portion of the first BEOL interconnect trace. The first tuning capacitor includes a second BEOL interconnect trace on a surface and sidewalls of the first insulator layer. The device includes a first via capture pad coupled to the second BEOL interconnect trace of the first tuning capacitor.

A method for fabricating a main capacitor coupled to tuning capacitors is described. The method includes forming a first plate of the main capacitor composed of a first back-end-of-line (BEOL) metallization layer. The method also includes depositing a first BEOL interconnect trace coupled to the first plate of the main capacitor through first BEOL sideline traces to form first plates of the tuning capacitors. The method further includes depositing an insulator layer on the first plate of the main capacitor and the first plates of the tuning capacitors. The method also includes depositing a second BEOL metallization layer on the insulator layer to form a second plate of the main capacitor and second BEOL interconnect traces on the insulator layer to form second plates of the tuning capacitors. The method further includes forming first vias coupled to the second plate of the main capacitor and second vias coupled to via capture pads coupled to the second BEOL interconnect traces.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 4A, 4B, and 4C are block diagrams illustrating a radio frequency integrated circuit (RFIC) chip having fin-type tuning capacitors, according to aspects of the present disclosure.

DETAILED DESCRIPTION

Figure 1:
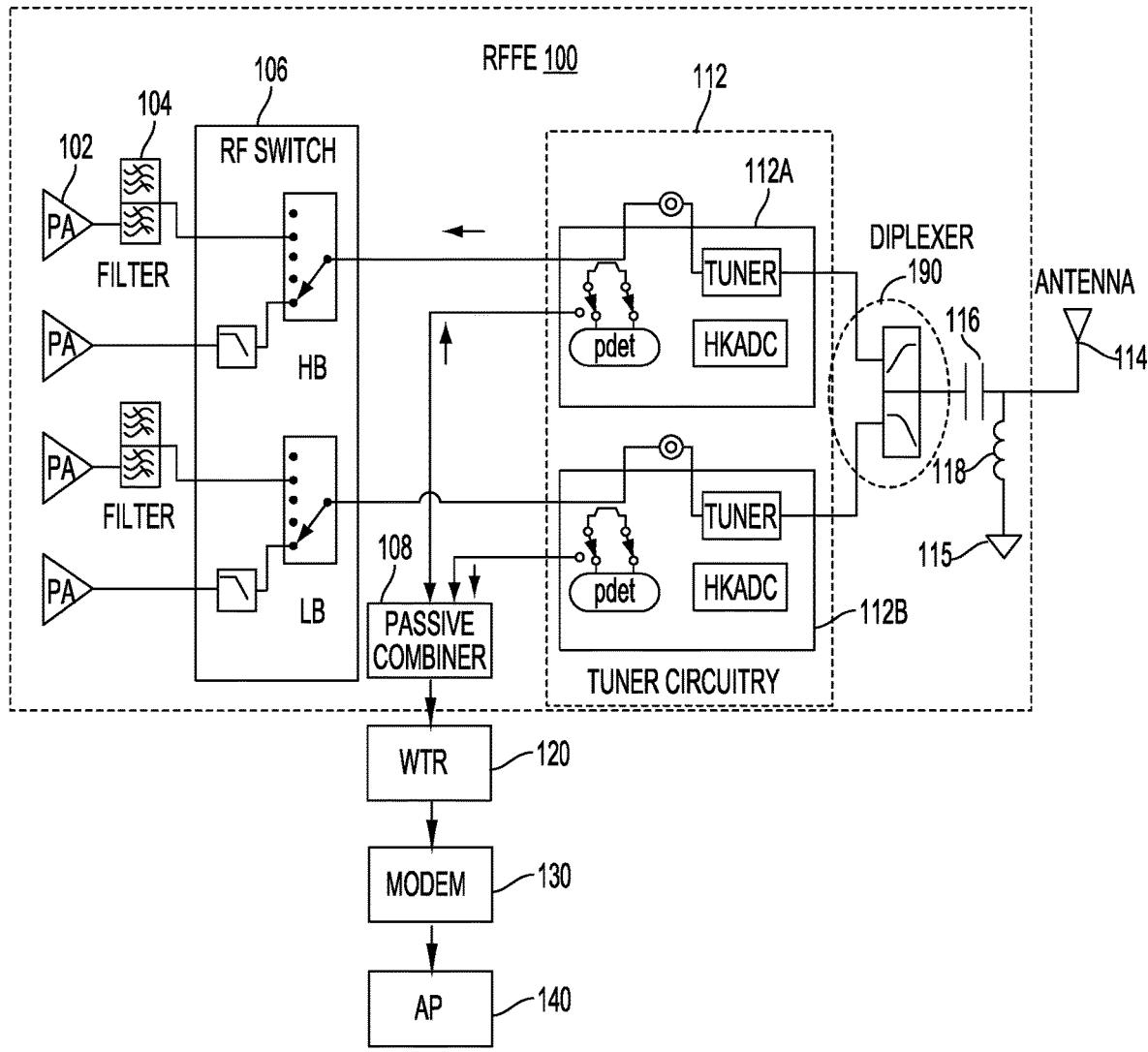
FIG. 1 is a schematic diagram of a radio frequency front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers is complicated by added circuit functions for supporting communication enhancements, such as fifth generation (5G) new radio (NR) communications systems. Further design challenges for mobile RF transceivers include using passive devices, which directly affect analog/RF performance considerations, including mismatch, noise, and other performance considerations.

Passive devices in mobile radio frequency (RF) transceivers may include high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates.

The amount of storage, or capacitance, for a given capacitor is contingent upon the materials used to make the plates and the insulator, the area of the plates, and the spacing between the plates. The insulating material is often a dielectric material. By adjusting the plate and dielectric materials, a parallel plate capacitor may be fabricated to exhibit a specified capacitance level. This parallel plate capacitor is fabricated on a semiconductor chip, and many designs place the capacitor over the substrate of the chip. A parallel plate capacitor such as a metal-insulator-metal (MIM) capacitor may be fabricated within an active device or a passive device, such as an integrated passive device (IPD). Unfortunately, capacitance variation may occur during an integrated circuit (IC) or a passive component radio frequency (RF) filter manufacturing process.

Capacitance variation during the IC or the passive component RF filter manufacturing process occurs due to the nature of the RF process. That is, due to the RF filter manufacturing process, an actual capacitance value varies between some numerical range (e.g., a manufacturing lot-to-lot variation, and/or a within-wafer variation). A tuning capacitor may compensate for the capacitance variation to more closely match a specified capacitance value. When this tuning capacitor is fabricated using via capture pads, a minimum tuning of the metal-insulator-metal (MIM) capacitance is limited by a minimum capture pad size, which is specified by a via formation process (e.g., a photo process), which may be very coarse.

Various aspects of the disclosure provide metal-insulator-metal (MIM) capacitance tuning using a fin capacitor design. The process flow for fabrication of the fin capacitor design may include front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

As described, the back-end-of-line (BEOL) interconnect layers may refer to the conductive interconnect layers (e.g., a first interconnect layer (M1) or metal one M1, metal two (M2), metal three (M3), metal four (M4), etc.) for electrically coupling to front-end-of-line (FEOL) active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to middle-of-line (MOL) interconnect layers, for example, to connect M1 to an oxide diffusion (OD) layer of an integrated circuit. The MOL interconnect layer may include a zero interconnect layer (M0) for connecting M1 to an active device layer of an integrated circuit. A BEOL first via (V2) may connect M2 to M3 or others of the BEOL interconnect layers.

According to aspects of the present disclosure, an integrated circuit is configured with a tuning capacitor configured according to a fin-type capacitor design. In one configuration, the integrated circuit includes a metal-insulator-metal (MIM) capacitor. The MIM capacitor includes a first plate composed of a first back-end-of-line (BEOL) metallization layer, a MIM dielectric layer on the first plate, and a second plate composed of a second BEOL metallization layer on the MIM dielectric layer. The integrated circuit also includes a first tuning capacitor.

In one configuration, the tuning capacitor is composed of a first back-end-of-line (BEOL) layer coupled to the first plate of the metal-insulator-metal (MIM) capacitor. The tuning capacitor includes a first dielectric layer on a first portion of the first BEOL interconnect trace and sidewalls of the first portion of the first BEOL interconnect trace. The tuning capacitor further includes a second BEOL interconnect trace on a surface and sidewalls of the first dielectric layer. The integrated circuit further includes a first via capture pad coupled to the second BEOL interconnect trace. The first via capture pad is placed outside a first capacitor area of the first tuning capacitor and the MIM capacitor. A target capacitance is determined by coupling the first via capture pad to a third BEOL metallization layer through a via.

According to aspects of the present disclosure, a fin-type capacitor design of a tuning capacitor can decrease an effective capacitance area so that fine capacitance tuning is possible. The effective capacitance area is defined by the fin width on the first back-end-of-line (BEOL) metallization layer (M1), a second BEOL metallization layer M2, and a minimum fin width is determined by a redistribution layer (RDL) capability of an integrated circuit device. In one configuration, a tuning capacitor is configured to support a tuning capacitance step provided by a five (5) micrometer (um) design, which is approximately 0.0078 pico farads (pF) (e.g., 0.3% assuming 2.58 pF target capacitance).

FIG. 1 is a schematic diagram of a radio frequency front end (RFFE) module 100 employing passive devices including a capacitor 116 (e.g., a fin-type metal-insulator-metal (MIM) tuning capacitor). The RFFE module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RFFE module 100.

The radio frequency front end (RFFE) module 100 also includes tuner circuitry 112 (e.g., first tuner circuitry 112A and second tuner circuitry 112B), the diplexer 190, the capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog to digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 190 is between the tuner component of the tuner circuitry 112 and the capacitor 116 (e.g., a fin-type metal-insulator-metal (MIM) tuning capacitor), the inductor 118, and the antenna 114. The diplexer 190 may be placed between the antenna 114 and the tuner circuitry 112 to provide high system performance from the radio frequency front end (RFFE) module 100 to a chipset including the wireless transceiver 120, the modem 130, and the application processor 140. The diplexer 190 also performs frequency domain multiplexing on both high band frequencies and low band frequencies. After the diplexer 190 performs its frequency multiplexing functions on the input signals, the output of the diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
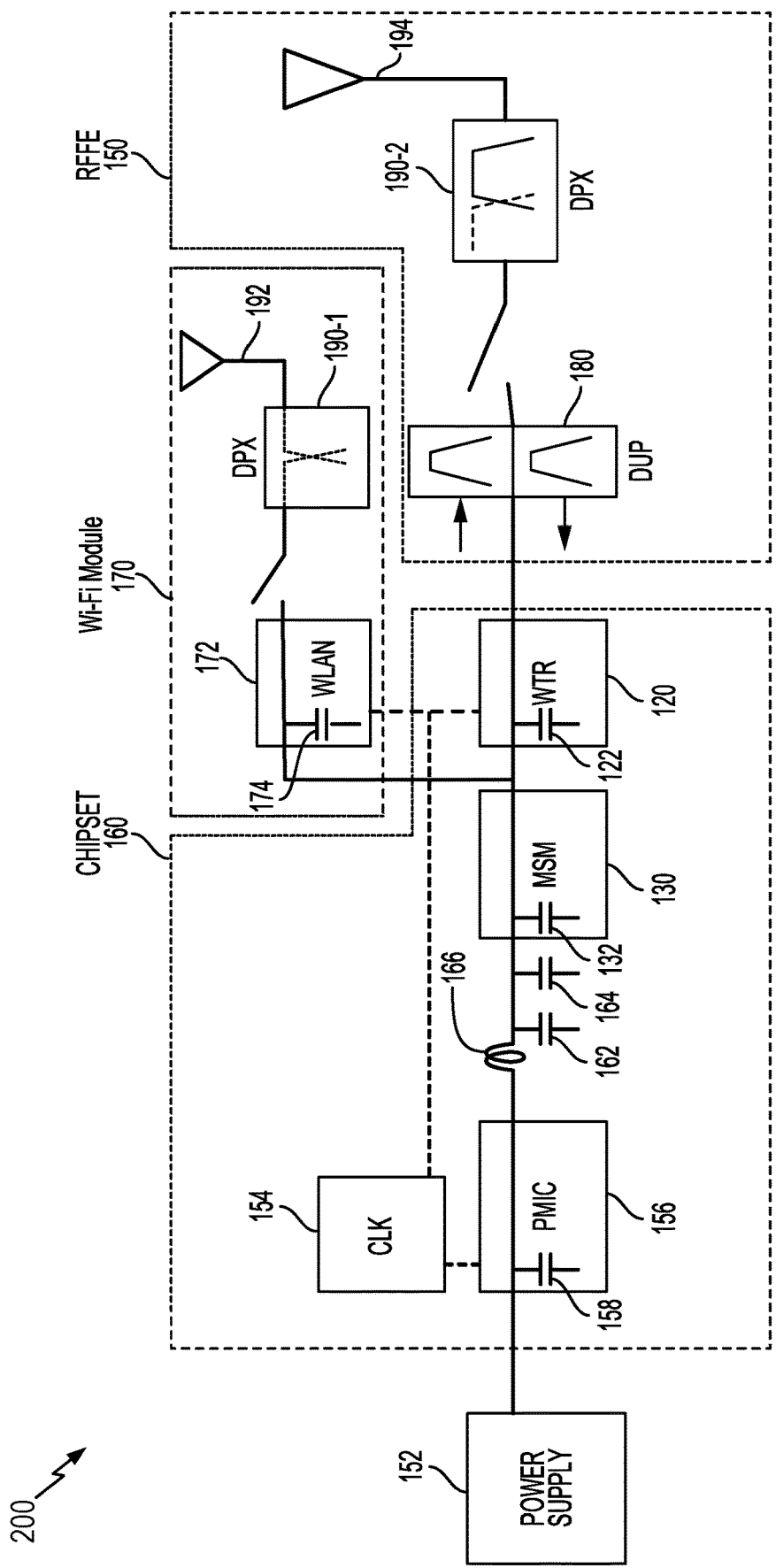
FIG. 2 is a schematic diagram of a radio frequency front end (RFFE) module employing passive devices for a chipset.

FIG. 2 is a schematic diagram of a radio frequency integrated circuit (RFIC) chip 200, having a wireless local area network (WLAN) (e.g., Wi-Fi) module 170 including a first diplexer 190-1 and a radio frequency front end (RFFE) module 150 including a second diplexer 190-2 for a chipset 160), including fin-type metal-insulator-metal (MIM) tuning capacitors. The Wi-Fi module 170 includes the first diplexer 190-1 communicably coupling an antenna 192 to a wireless local area network module (e.g., WLAN module 172). The RFFE module 150 includes the second diplexer 190-2 communicably coupling an antenna 194 to a wireless transceiver (WTR) 120 through a duplexer 180. The wireless transceiver 120 and the WLAN module 172 of the Wi-Fi module 170 are coupled to a modem (mobile station modem (MSM), e.g., baseband modem) 130 that is powered by a power supply 152 through a power management integrated circuit (PMIC) 156. The chipset 160 also includes capacitors 162 and 164, as well as an inductor(s) 166 to provide signal integrity.

The power management integrated circuit (PMIC) 156, the modem 130, the wireless transceiver 120, and the wireless local area network (WLAN) module 172 each include capacitors (e.g., 158, 132, 122, and 174) and operate according to a clock 154. In addition, the inductor 166 couples the modem 130 to the PMIC 156. The design of the radio frequency integrated circuit (RFIC) chip 200 includes metal-insulator-metal (MIM) capacitors configured with fin-type MIM tuning capacitors, according to aspects of the present disclosure.

Figure 3:
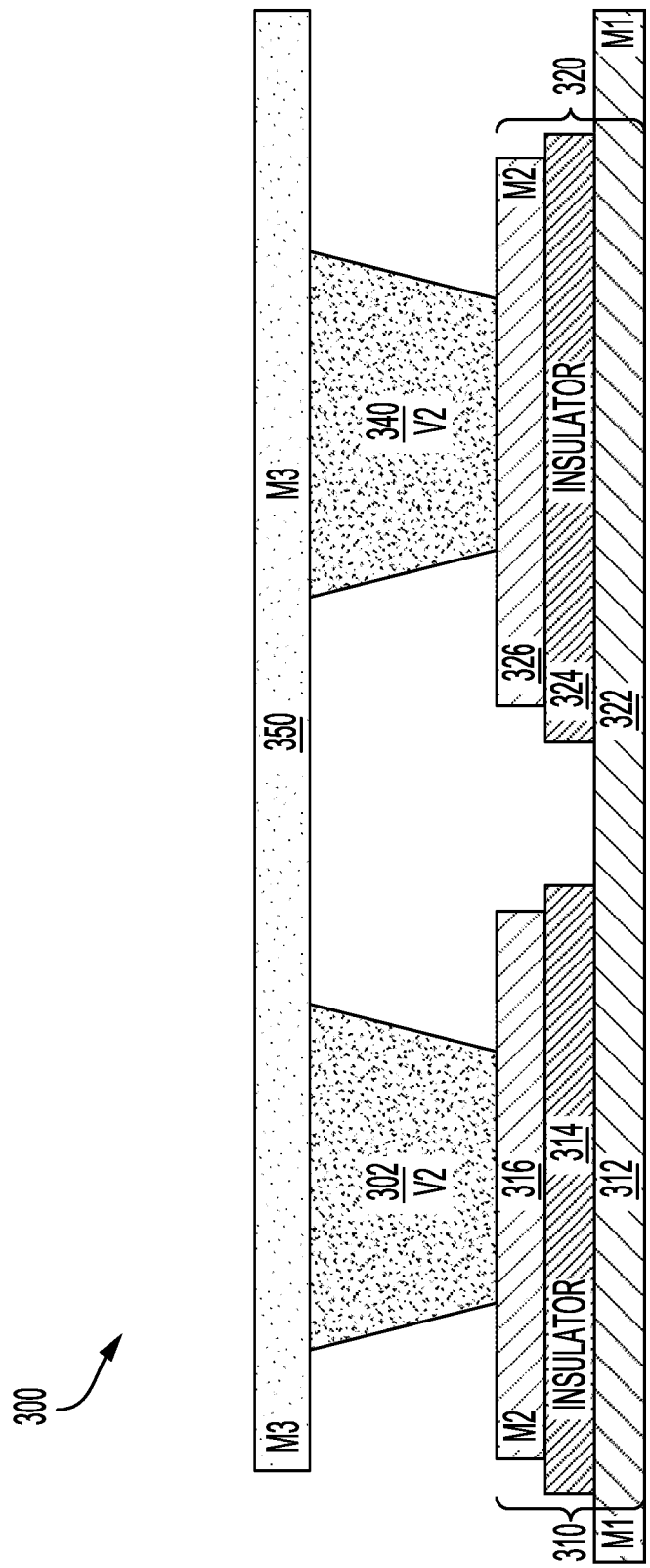
FIG. 3 is a block diagram illustrating a cross-sectional view of an integrated circuit (IC) device including a main capacitor and a tuning capacitor, in accordance with aspects of the present disclosure.

FIG. 3 is a block diagram illustrating a cross-section of an integrated circuit (IC) device 300 including a main capacitor 310 and a tuning capacitor 320, in accordance with aspects of the present disclosure. In one configuration, the main capacitor 310 and the tuning capacitor 320 are formed from an interconnect stack of the IC device 300 including multiple back-end-of-line (BEOL) metallization layers (M1, M2, M3, . . . , Mn) on a semiconductor substrate (e.g., a diced silicon wafer). For example, the main capacitor 310 and the tuning capacitor 320 are metal-insulator-metal (MIM) capacitors. In this example, the main capacitor 310 and the tuning capacitor 320 are formed using plates of the M1 and M2 metallization layers, below the metallization layer M3.

In one configuration, the main capacitor 310 includes a first plate 312, an insulator 314 on the first plate 312, and a second plate 316 on the insulator 314. The first plate 312 is formed from the metallization layer M1, and the second plate 316 is formed from the metallization layer M2. The tuning capacitor 320 includes a first plate 322, an insulator 324 on the first plate 322, and a second plate 326 on the insulator 324. Similar to the main capacitor 310, the first plate 322 is formed from the metallization layer M1, and the second plate 326 is formed from the metallization layer M2. In particular, the main capacitor 310 and the tuning capacitor 320 share the metallization layer M1 as a first plate (e.g., 312/322) and are coupled to a metallization layer M3 350 through a first via 302 and a second via 340, respectively.

According to aspects of the present disclosure, the second plate 326 of the tuning capacitor 320 is configured and sized to operate as a via capture pad. Unfortunately, a minimum size of the second plate 326 configured as a via capture pad in the metallization layer M2 is approximately thirty (30) microns for each side of a square pad. In this configuration, a five (5) micron width between a via edge and a pad edge of the second plate 326 limits a minimum via size to approximately twenty (20) microns (e.g. using a photo process). Based on this configuration of the second plate 326 (e.g., a 30×30 micron pad), a minimum tuning capacitance available from the tuning capacitor 320 is predetermined (e.g., 0.28 pico-farads (pF)). In addition, the main capacitor 310 is fabricated with a predetermined target capacitance (e.g., 2.69 gigahertz (GHz): 2.58 pF). Based on this predetermined target capacitance of the main capacitor 310, the predetermined minimum tuning capacitance of the tuning capacitor 320 is approximately eleven percent (11%), which may be too coarse and insufficient for radio frequency (RF) products, such as the radio frequency integrated circuit (RFIC) chip 200 of FIG. 2.

FIGS. 4A, 4B, and 4C are block diagrams illustrating a radio frequency integrated circuit (RFIC) chip 400 having fin-type tuning capacitors, according to aspects of the present disclosure. Representatively, the RFIC chip 400 includes a main capacitor 410 and tuning capacitors 420 that are selectively enabled using via formation to adjust a tuning capacitance of the main capacitor 410. For example, the main capacitor 410 and the tuning capacitors 420 are metal-insulator-metal (MIM) capacitors. In this example, the main capacitor 410 and the tuning capacitors 420 are formed using plates of the M1 and M2 metallization layers, below the metallization layer M3.

In aspects of the present disclosure, the tuning capacitors 420 are configured as fin-type tuning capacitors composed of first BEOL interconnect traces 418 coupled to a first plate 412 of the main capacitor 410 through first BEOL sideline traces 428. FIG. 4B illustrates an exploded view of a first tuning capacitor 420-1 of FIG. 4A, including a first insulator layer 424 on a first portion of the first BEOL interconnect traces 418. The first tuning capacitor 420-1 further includes a second BEOL interconnect trace 432-1 on the first insulator layer 424. In this configuration, a cross-sectional view of the first tuning capacitor 420-1 includes a first plate 422, a first insulator layer 424 on the first plate 422, and sidewalls of the first plate 422. The first tuning capacitor 420-1 further includes a second plate 426 (as highlighted) formed from the second BEOL interconnect trace 432-1 on a surface and sidewalls of the first insulator layer 424 to complete formation of the first tuning capacitor 420-1.

As shown in FIG. 4A, the radio frequency integrated circuit (RFIC) chip 400 further includes a first via capture pad 430-1 coupled to the second BEOL interconnect trace 432-1. The first via capture pad 430-1 is placed outside a first capacitor area of the first tuning capacitor 420-1 and the main capacitor 410.

Referring again to FIG. 4B, a fin-type capacitor design of the first tuning capacitor 420-1 can increase an effective capacitance area so that fine capacitance tuning is possible. In one configuration, an effective capacitance area is defined by a fin width 460 (e.g., two (2) microns) of the first BEOL interconnect traces 418 and the second BEOL interconnect trace 432-1. In addition, a minimum fin width is determined by a redistribution layer (RDL) capability of the radio frequency integrated circuit (RFIC) chip 400. In this configuration, a first width W1 of the first insulator layer 424 (e.g., a passivation (silicon nitride) layer) is greater than the fin width 460 of the first BEOL interconnect traces 418. In addition, a second width W2 of the first insulator layer 424 is greater than a fin width 470 of the second BEOL interconnect trace 432-1. In one example, a tuning capacitance step provided by the fin width 460 of five (5) micrometers (um) is approximately 0.0078 pico-farads (pF) (e.g., a tuning step of 0.3%, assuming a 2.58 pF target capacitance). A target capacitance is determined by coupling the first via capture pad 430-1 to a metallization layer M3 450 through a second via 440, as shown in FIG. 4C and Table I.

TABLE I

Example: Fine Tuning Capacitance Value of Fin-Type Tuning Capacitor

|  | Capture Pad:<br>30 × 30 um | Fin:<br>10 × 10 um | Fin:<br>5 × 5 um | Fin:<br>2 × 2 um |
| --- | --- | --- | --- | --- |
| Capacitance<br>% vs. target | 0.28 pF<br>11% | 0.031 pF<br>1.2% | 0.0078 pF<br>0.3% | 0.0012 pF<br>0.05% |

As shown in FIG. 3, based on this predetermined target capacitance of the main capacitor 310, the predetermined minimum tuning capacitance of the tuning capacitor 320 is approximately eleven percent (11%), which may be too coarse and insufficient for radio frequency (RF) products, such as the radio frequency integrated circuit (RFIC) chip 200 of FIG. 2. The tuning capacitance step (e.g., 0.28 pico-farads (pF)) having an 11% tuning capacitance versus the target capacitance (e.g., 2.58 pF) for a via capture pad (e.g., 30×30 micrometers (um)) is shown in column 1. Column 2 illustrates a tuning capacitance step (e.g., 0.031 pF) having a 1.2% tuning capacitance versus the target capacitance for a fin-type tuning capacitor (e.g., 10×10 microns). Column 3 illustrates a tuning capacitance step (e.g., 0.0078 pF) having a 0.3% tuning capacitance versus the target capacitance for a fin-type tuning capacitor (e.g., 5×5 micrometers (um)). Column 4 illustrates a tuning capacitance step (e.g., 0.0012 pF) having a 0.05% tuning capacitance versus the target capacitance for a fin-type tuning capacitor (e.g., 2×2 um).

FIG. 4C is a cross-sectional view illustrating the main capacitor 410 coupled to the first tuning capacitor 420-1 through the metallization layer M3 450. In this configuration, the main capacitor 410 includes a first plate 412, an insulator layer 414 on the first plate 412, and a second plate 416 on the insulator layer 414. The first plate 412 is formed from the metallization layer M1, and the second plate 416 is formed from the metallization layer M2. The first tuning capacitor 420-1 includes the first plate 422, the first insulator layer 424 on the first plate 422, and the second plate 426, formed from the second BEOL interconnect trace 432-1, on the first insulator layer 424. Similar to the main capacitor 410, the first plate 422 is formed from the metallization layer M1, and the second plate 426 is formed from the metallization layer M2. In particular, the main capacitor 410 and the tuning capacitors 420 share the metallization layer M1 as a first plate (e.g., 412/422) and are coupled to the metallization layer M3 450 through a first via 402 and a second via 440, respectively. Selective placement of the first via 402 and the second via 440 provide a target capacitance level.

Figure 5A:
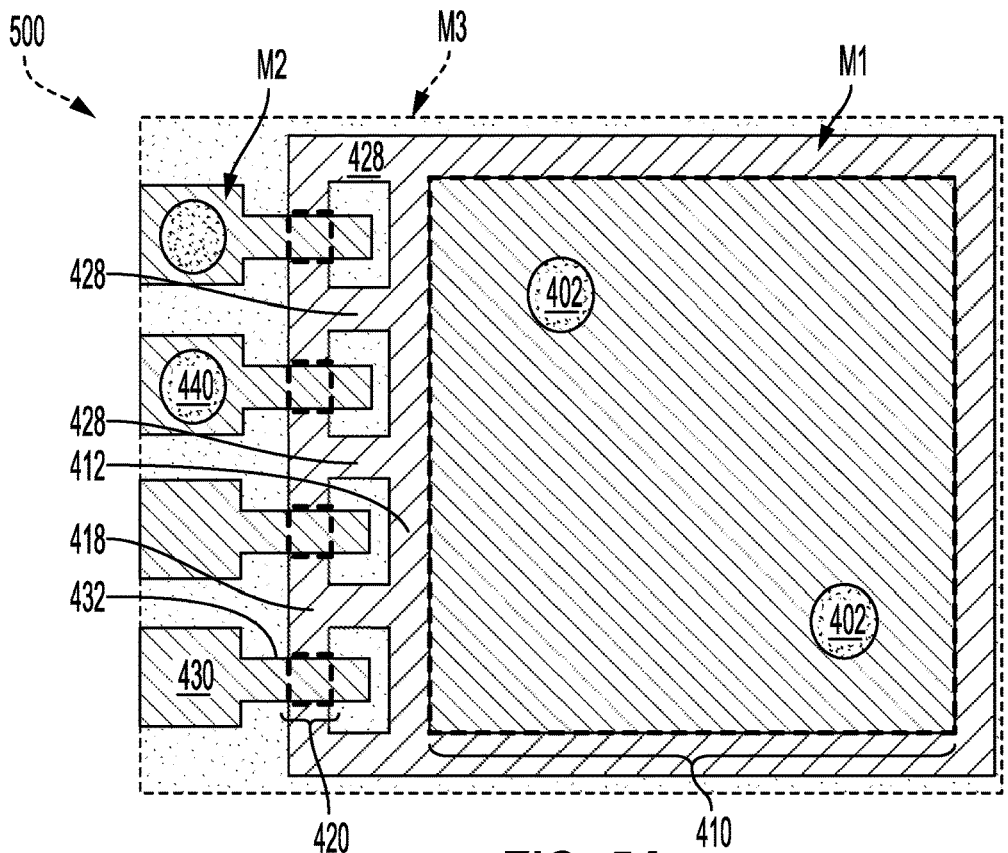
FIGS. 5A and 5B are overhead diagrams illustrating radio frequency integrated circuit (RFIC) chips having fin-type tuning capacitors, according to aspects of the present disclosure.
Figure 5B:
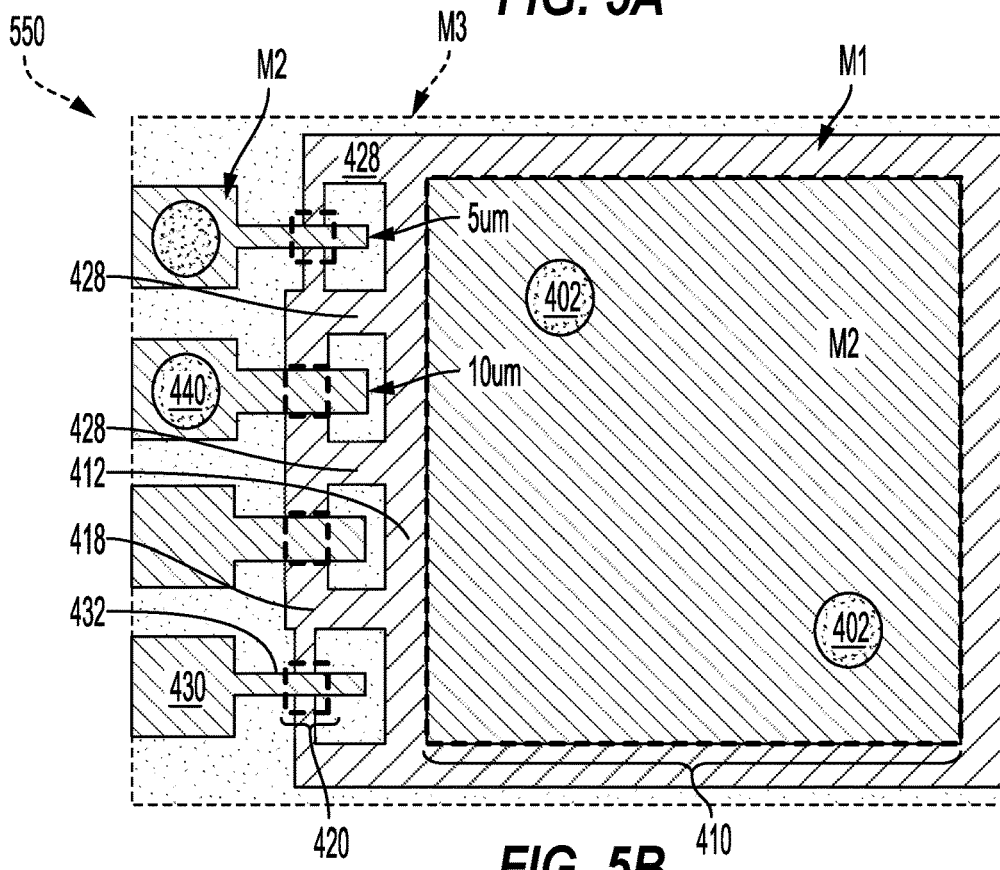

FIGS. 5A and 5B are overhead diagrams illustrating radio frequency integrated circuit (RFIC) chips 500 and 550, respectively, having fin-type tuning capacitors, according to aspects of the present disclosure. The RFIC chip 500 shown in FIG. 5A is similar to the RFIC chip 400 shown in FIG. 4A, including the main capacitor 410 and tuning capacitors 420 of FIG. 4A. In this aspect of the present disclosure, the tuning capacitors 420 are formed on one side of the main capacitor 410 according to a single side-fin configuration. This configuration may be beneficial to reduce a footprint of the RFIC chip 500.

The radio frequency integrated circuit (RFIC) chip 550 shown in FIG. 5B is similar to the RFIC chip 500 shown in FIG. 5A, including the main capacitor 410 and tuning capacitors 420. In this aspect of the present disclosure, the tuning capacitors 420 are also formed on one side of the main capacitor 410, according to the single side-fin configuration. In this configuration, mixed fin widths are provided with the single side-fin configuration of FIG. 5A. For example, the widths of the first BEOL interconnect traces 418 and the second BEOL interconnect traces 432 may be formed with different widths (e.g., 5 microns or 10 microns). This configuration may be beneficial for enabling various tuning capacitance intervals by using different fin widths, as shown in Table II.

TABLE II

Capacitance Tuning Intervals

|  | −2 | −1 | 2.58 (target) | +1 | +2 |
|---|---|---|---|---|---|
| 30 um pad | 2.524 (−21.7%) | 2.552 (−10.9%) | 2.58 | 2.608 (+21.7%) | 2.636 (+10.9%) |
| 10 um trench | 2.518 (−2.4%) | 2.549 (−1.2%) | 2.58 | 2.611 (+1.2%) | 2.642 (+2.4%) |
| 5 um trench | 2.564 (−0.6%) | 2.572 (−0.3%) | 2.58 | 2.588 (+0.3%) | 2.596 (+0.6%) |

Figure 6A:
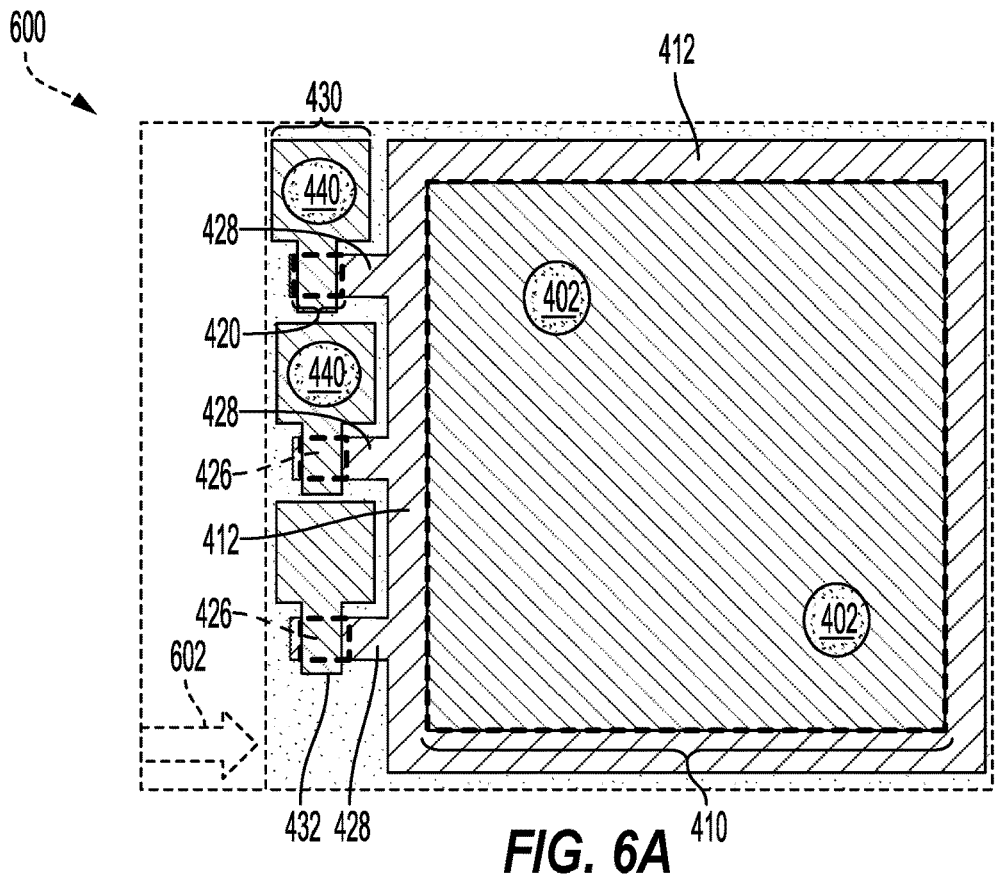
FIGS. 6A and 6B are overhead diagrams illustrating radio frequency integrated circuit (RFIC) chips having fin-type tuning capacitors, according to aspects of the present disclosure.
Figure 6B:
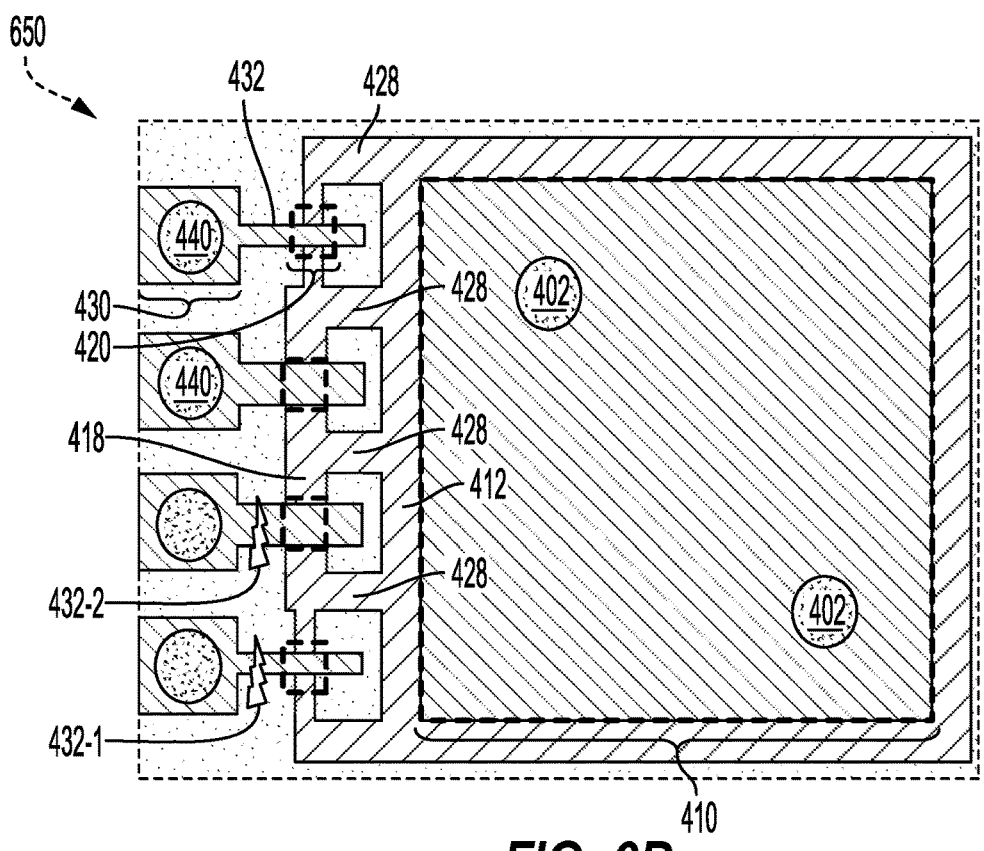

FIGS. 6A and 6B are overhead diagrams illustrating radio frequency integrated circuit (RFIC) chips 600 and 650, respectively, having fin-type tuning capacitors, according to aspects of the present disclosure. The RFIC chip 600 shown in FIG. 6A is similar to the RFIC chip 500 shown in FIG. 5A, including the main capacitor 410 and tuning capacitors 420 of FIG. 4A. In this aspect of the present disclosure, the tuning capacitors 420 are also formed on one side of the main capacitor 410 according to a single side-fin configuration. This configuration may be beneficial to reduce a footprint of the RFIC chip 500 by placing the via capture pads 430 and the second BEOL interconnect traces 432 orthogonal to the first BEOL sideline traces 428. In particular, this configuration rotates the via capture pads 430 and the second BEOL interconnect traces 432 to provide a saved area 602 relative to the configuration shown in FIG. 5A.

The radio frequency integrated circuit (RFIC) chip 650 shown in FIG. 6B is similar to the RFIC chip 550 shown in FIG. 5B, including the main capacitor 410 and tuning capacitors 420 of FIG. 4A. In this aspect of the present disclosure, the tuning capacitors 420 are also formed on one side of the main capacitor 410 according to the single side-fin configuration. In this example, mixed fin widths are also provided to vary the single side-fin configuration of FIG. 5B. In particular, the widths of the first BEOL interconnect traces 418 and the second BEOL interconnect traces 432 are formed with different widths (e.g., 5 microns or 10 microns). In this configuration, a desired tuning capacitance is configured by fuse cutting the second BEOL interconnect traces 432-1 and 432-2, rather than selective via formation as shown in FIG. 5B.

FIGS. 7A-7F are diagrams showing a process of fabricating the radio frequency integrated circuit (RFIC) chip 400 of FIGS. 4A-4C, including the main capacitor 410 and tuning capacitors 420 that are selectively enabled using via formation to adjust a tuning capacitance of the main capacitor 410, according to aspects of the present disclosure.

Figure 7A:
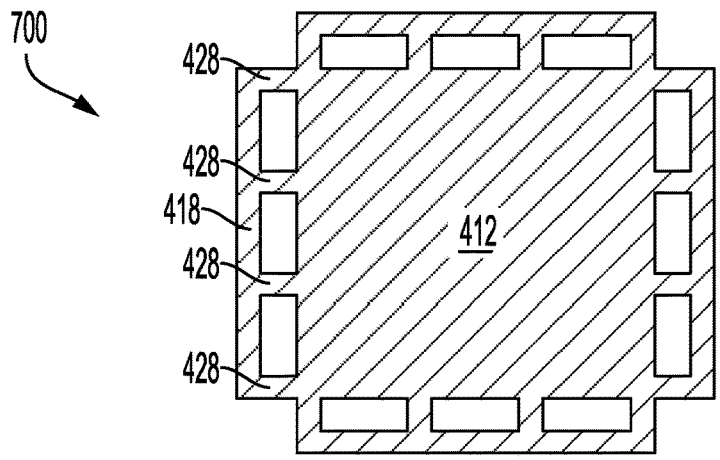
FIGS. 7A-7F are diagrams showing a process of fabricating the radio frequency integrated circuit (RFIC) chip of FIGS. 4A-4C, including a main capacitor and fine-type tuning capacitors that are enabled using via formation to adjust a tuning capacitance of the main capacitor, according to aspects of the present disclosure.

FIG. 7A is an overhead view of the first plate 412 of the main capacitor 410, and the first BEOL sideline traces 428 and the first BEOL interconnect traces 418 of the tuning capacitors 420 of FIGS. 4A-4C, according to aspects of the present disclosure. In this configuration, at step 700, the first BEOL interconnect traces 418, the first BEOL sideline traces 428, and the first plate 412 of the main capacitor 410 are formed from the metallization layer M1, for example, as shown in FIG. 4A.

Figure 7B:
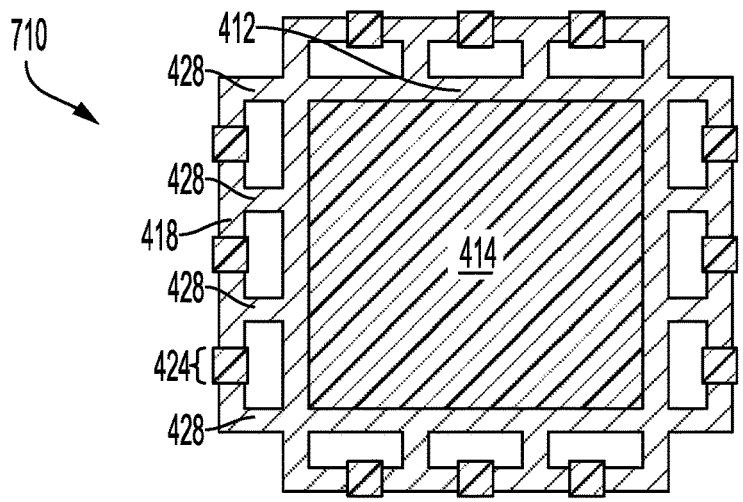

FIG. 7B further illustrates fabrication of the main capacitor 410 and the tuning capacitors 420 of FIGS. 4A-4C, according to aspects of the present disclosure. At step 710, the insulator layer 414 (e.g., a main insulator layer) is deposited on the first plate 412, and the insulator layer (e.g., the first insulator layer 424) is deposited on predetermined portions of the first BEOL interconnect traces 418 of the tuning capacitors 420, as shown in FIGS. 4B and 4C. For example, FIG. 4B illustrates an exploded view of a first tuning capacitor 420-1 of FIG. 4A, including the first insulator layer 424 on a first plate 422 and sidewalls of the first plate 422. In one configuration, the first insulator layer 424 is an insulator layer (e.g., silicon nitride (SiN)).

Figure 7C:
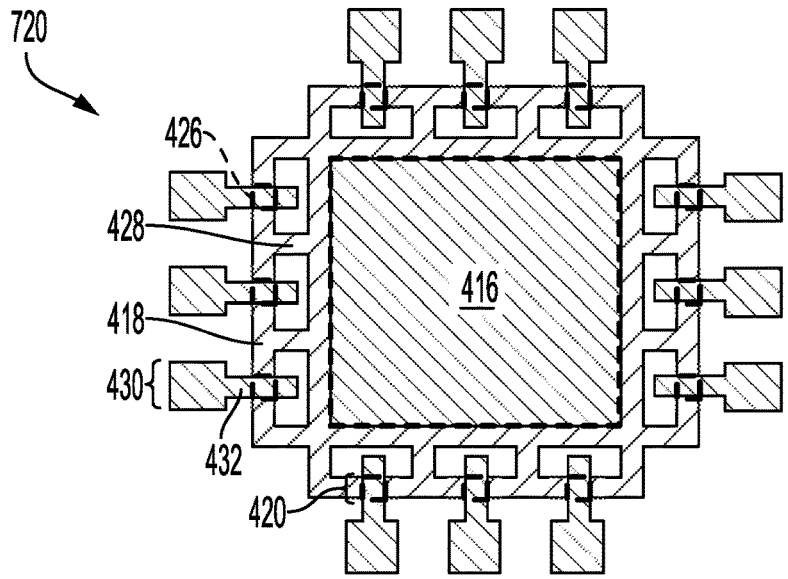

FIG. 7C further illustrates fabrication of the main capacitor 410 and the tuning capacitors 420 of FIGS. 4A-4C, according to aspects of the present disclosure. At step 720, a metallization layer M2 is deposited on the insulator layer 414 to form the second plate 416 of the main capacitor 410. In addition, the metallization layer M2 is deposited on the insulator layer 414 on the predetermined portions of the first BEOL interconnect traces 418 to form the second plate 426 of the tuning capacitors 420.

For example, FIG. 4B illustrates the exploded view of the first tuning capacitor 420-1 of FIG. 4A, including a first insulator layer 424 on the first plate 422 and sidewalls of the first plate 422 of the first tuning capacitor 420-1. The first tuning capacitor 420-1 further includes the second plate 426 on a surface and sidewalls of the first insulator layer 424. As shown in FIG. 4A, the radio frequency integrated circuit (RFIC) chip 400 further includes a first via capture pad 430-1 coupled to the second BEOL interconnect traces 432. The first via capture pad 430-1, the second BEOL interconnect traces 432 of the tuning capacitors 420, and the second plate 416 may be formed by a copper (CU) deposition or CU plating. Although a CU deposition is described, other conductive materials are also contemplated for the metallization layer M2.

Figure 7D:
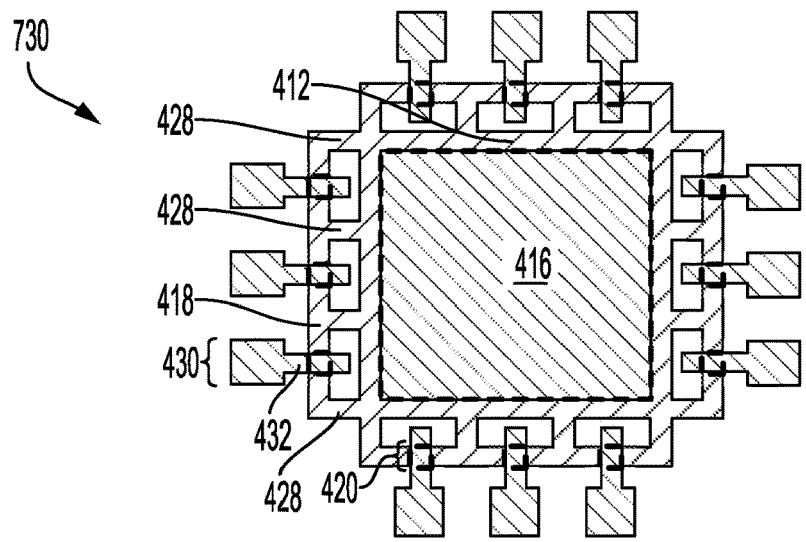

FIG. 7D further illustrates fabrication of the main capacitor 410 and the tuning capacitors 420 of FIGS. 4A-4C, according to aspects of the present disclosure. At step 730, the main capacitor 410 and the tuning capacitors 420 of FIGS. 4A-4C are subjected to capacitance measurements for determining via positions on the second plate 416 and on selected ones of the via capture pads 430.

Figure 7E:
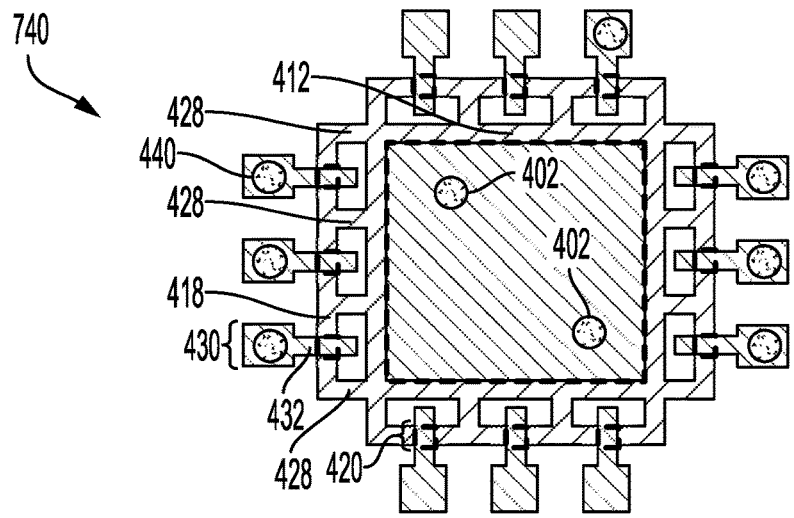

FIG. 7E further illustrates fabrication of the main capacitor 410 and the tuning capacitors 420 of FIGS. 4A-4C, according to aspects of the present disclosure. At step 740, the first vias 402 and the second vias 440 are formed at the selected via positions determined in FIG. 7D.

Figure 7F:
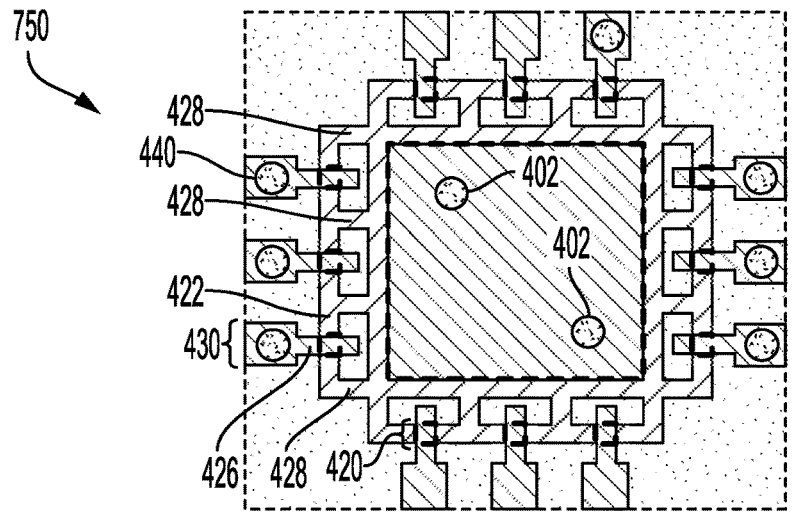

FIG. 7F further illustrates fabrication of the main capacitor 410 and the tuning capacitors 420 of FIGS. 4A-4C, according to aspects of the present disclosure. At step 750, a metallization layer M3 is deposited on the first vias 402 and the second vias 440 formed in FIG. 7E. For example, FIG. 4C illustrates the main capacitor 410 and the tuning capacitor 420-1 sharing the metallization layer M1 as a first plate (e.g., 412/422) and coupled to the metallization layer M3 450 through the first via 402 and the second via 440, respectively. Selective placement of the first vias 402 and the second vias 440 provide a target capacitance level, for example, as shown in FIG. 8.

Figure 8:
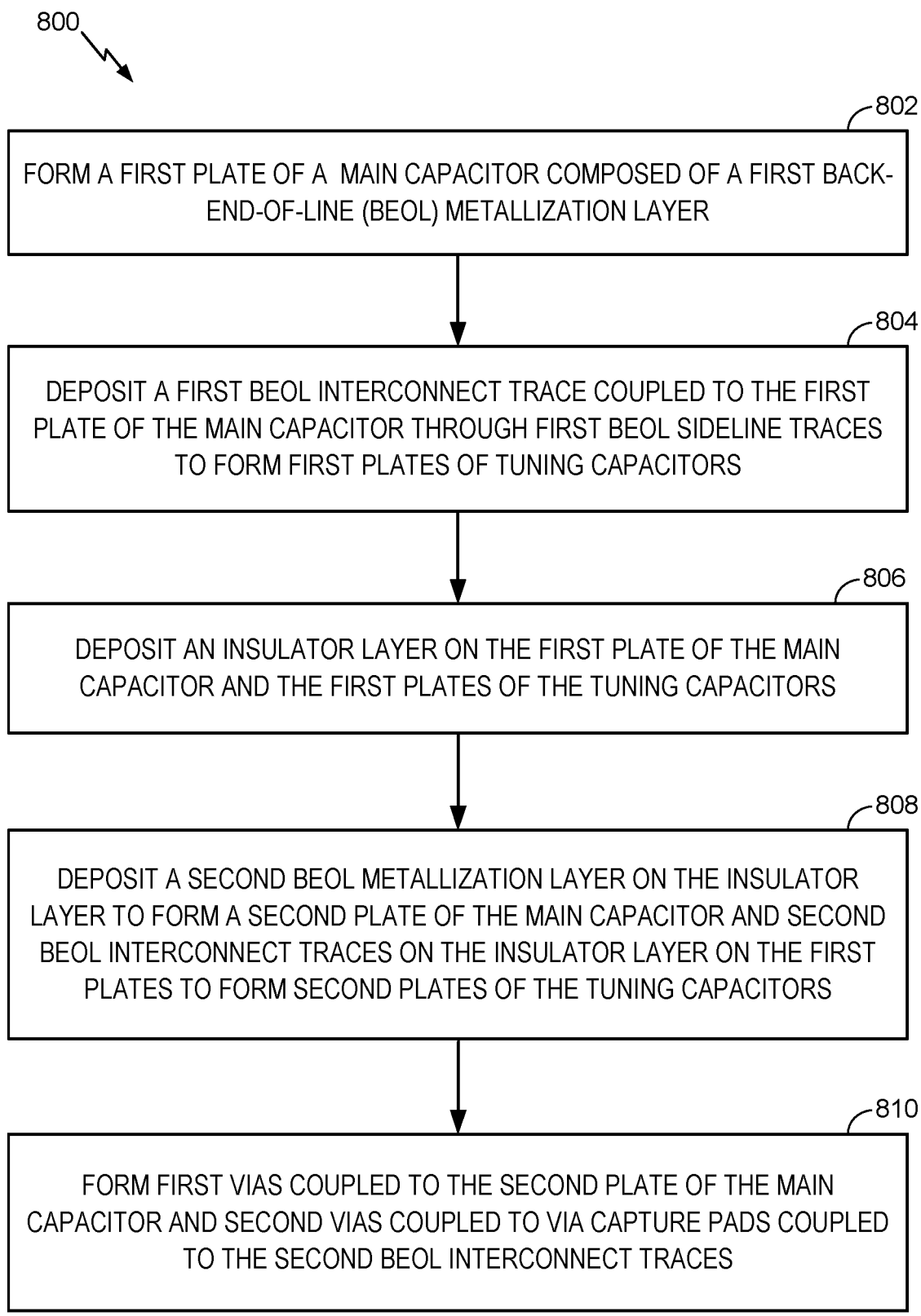
FIG. 8 is a process flow diagram illustrating a method for fabricating a main capacitor coupled to tuning capacitors, according to an aspect of the present disclosure.

FIG. 8 is a process flow diagram illustrating a method for fabricating a main capacitor coupled to tuning capacitors, according to an aspect of the present disclosure. A method 800 begins in block 802, in which a first plate of a main capacitor is formed from a first back-end-of-line (BEOL) metallization layer. For example, as shown in FIG. 7A, at step 700, the first plate 412 of the main capacitor 410 is formed from the M1 metallization layer, for example, as also shown in FIG. 4A. In block 804, a first BEOL interconnect trace is deposited and coupled to the first plate of the main capacitor through first BEOL sideline traces to form first plates of the tuning capacitors. For example, as shown in FIG. 7A, at step 700, the first BEOL interconnect traces 418, and the first BEOL sideline traces 428 are formed from the M1 metallization layer, for example, as also shown in FIG. 4A.

In block 806, an insulator layer is deposited on the first plate of the main capacitor and the first plates of the tuning capacitors. As shown in FIG. 7B, at step 710, the insulator layer 414 is deposited on the first plate 412, and the first insulator layer 424 is deposited on predetermined portions of the first BEOL interconnect traces 418 of the tuning capacitors 420, as also shown in FIGS. 4B and 4C. In block 808, a second BEOL metallization layer is deposited on the insulator layer to form a second plate of the main capacitor, and second BEOL interconnect traces are deposited on the insulator layer on the first plates to form second plates of the tuning capacitors. As shown in FIG. 7C, at step 720, an M2 metallization layer is deposited on the insulator layer 414 to form the second plate 416 of the main capacitor 410. In addition, the M2 metallization layer is deposited on the insulator layer 414 on the predetermined portions of the first BEOL interconnect traces 418 to form the second plate 426 of the tuning capacitors 420.

Referring again to FIG. 8, in block 810, first vias are formed and coupled to the second plate of the main capacitor, and second vias are coupled to via capture pads coupled to the second BEOL interconnect traces. For example, as shown in FIG. 7D, at step 730, the main capacitor 410 and the tuning capacitors 420 of FIGS. 4A-4C are subjected to capacitance measurements for determining via positions on the second plate 416 and on selected ones of the via capture pads 430. In addition, as shown in FIG. 7E, at step 740, the first vias 402 and the second vias 440 are formed at the selected via positions determined in FIG. 7D.

The method 800 may also include forming a second tuning capacitor composed of the first BEOL interconnect trace coupled to the main capacitor, and a second insulator layer on a second portion of the first BEOL interconnect trace and sidewalls of the second portion of the first BEOL interconnect trace. The second tuning capacitor includes the second BEOL interconnect trace on a surface and sidewalls of the second insulator layer. The method 800 may further include forming a second via capture pad coupled to the second BEOL interconnect trace outside a second capacitor area of the second tuning capacitor and the main capacitor.

According to a further aspect of the present disclosure, an integrated circuit (IC) includes a main capacitor. In one configuration, the IC has means for tuning the main capacitor. In one configuration, the tuning means may be the tuning capacitors 420, as also shown in FIGS. 4B and 4C. In another aspect, the aforementioned means may be any structure or any material configured to perform the functions recited by the aforementioned means.

Figure 9:
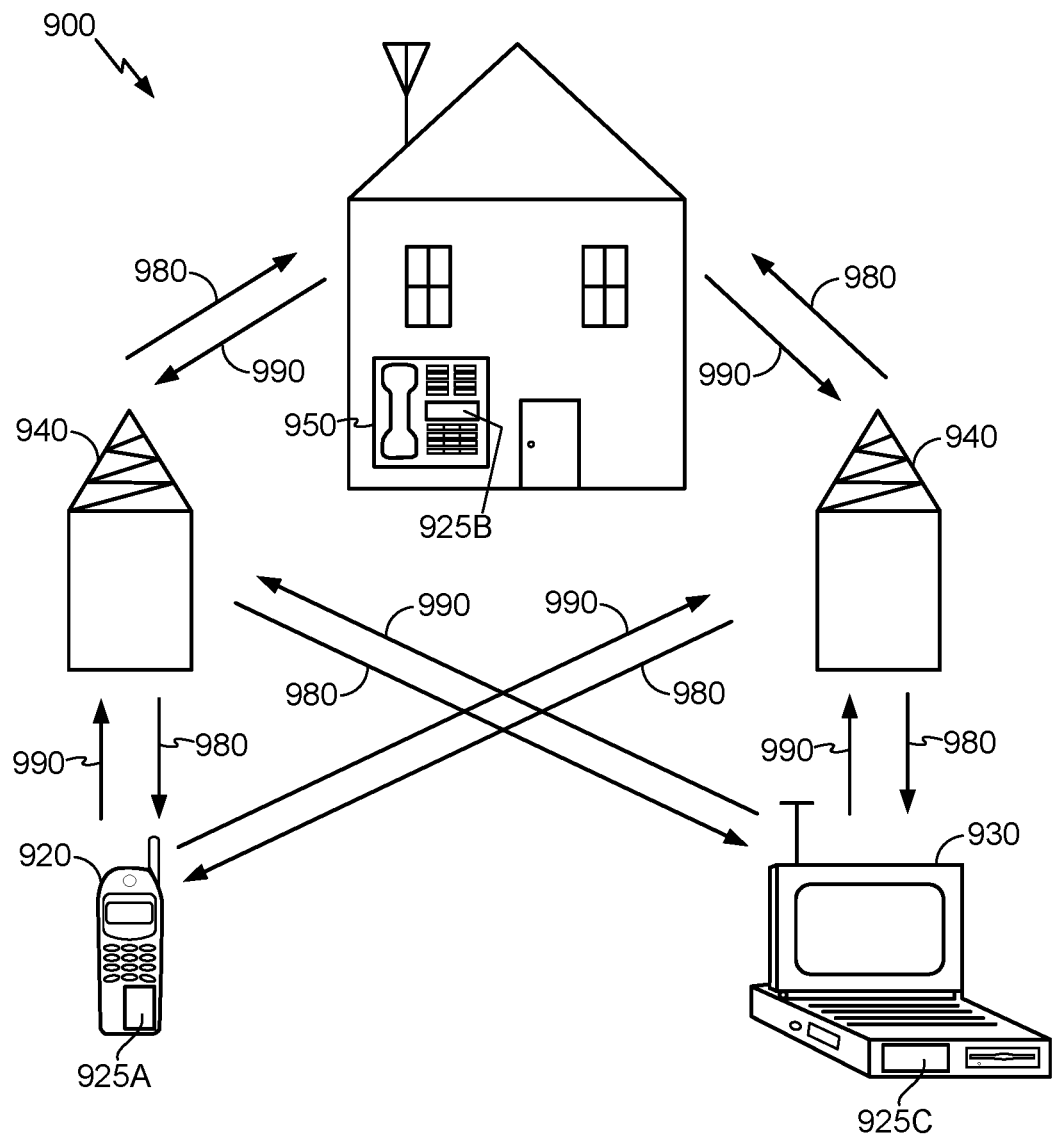
FIG. 9 is a block diagram showing an exemplary wireless communications system in which a configuration of the present disclosure may be advantageously employed.

FIG. 9 is a block diagram showing an exemplary wireless communications system 900 in which an aspect of the disclosure may be advantageously employed. For purposes of illustration, FIG. 9 shows three remote units 920, 930, and 950 and two base stations 940. It will be recognized that wireless communications systems may have many more remote units and base stations. Remote units 920, 930, and 950 include integrated circuit (IC) devices 925A, 925C, and 925B that include the disclosed fin-type tuning capacitor. It will be recognized that other devices may also include the disclosed fin-type tuning capacitors, such as the base stations, switching devices, and network equipment. FIG. 9 shows forward link signals 980 from the base station 940 to the remote units 920, 930, and 950, and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 9 illustrates remote units according to the aspects of the present disclosure, the present disclosure is not limited to these exemplary illustrated units. Aspects of the present disclosure may be suitably employed in many devices, which include the disclosed fin-type tuning capacitors.

Figure 10:
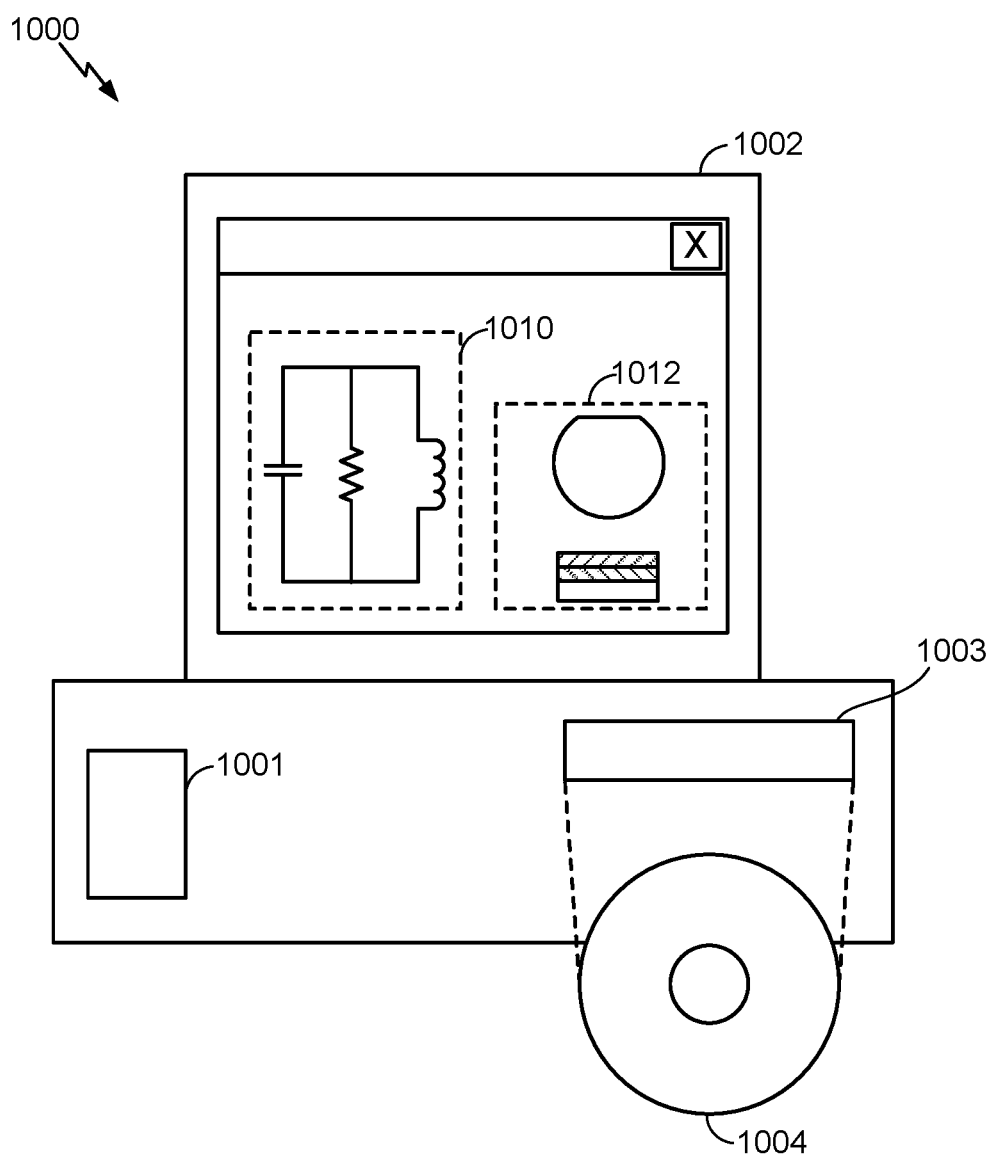
FIG. 10 is a block diagram illustrating a design workstation used for circuit, layout, and logic design of a semiconductor component according to one configuration.

FIG. 10 is a block diagram illustrating a design workstation used for circuit, layout, and logic design of a semiconductor component, such as the capacitors disclosed above. A design workstation 1000 includes a hard disk 1001 containing operating system software, support files, and design software such as Cadence or OrCAD. The design workstation 1000 also includes a display 1002 to facilitate design of a circuit 1010 or a radio frequency (RF) component 1012 such as a fin-type tuning capacitor. A storage medium 1004 is provided for tangibly storing the design of the circuit 1010 or the RF component 1012 (e.g., the fin-type MIM tuning capacitors). The design of the circuit 1010 or the RF component 1012 may be stored on the storage medium 1004 in a file format such as GDSII or GERBER. The storage medium 1004 may be a compact disc read-only memory (CD-ROM), digital versatile disc (DVD), hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the radio frequency (RF) component 1012 by decreasing the number of processes for designing semiconductor wafers.

Implementation examples are described in the following numbered clauses:

1. A device, comprising: a main capacitor comprising a first plate composed of a first back-end-of-line (BEOL) metallization layer, a main insulator layer on the first plate, and a second plate on the main insulator layer and composed of a second BEOL metallization layer; a first tuning capacitor comprising a first portion of a first BEOL interconnect trace coupled to the first plate of the main capacitor through first BEOL sideline traces, a first insulator layer on a surface and sidewalls of the first portion of the first BEOL interconnect trace, and a second BEOL interconnect trace on a surface and sidewalls of the first insulator layer; and a first via capture pad coupled to the second BEOL interconnect trace of the first tuning capacitor.

2. The device of clause 1, in which the first BEOL interconnect trace is orthogonal to the second BEOL interconnect trace.

3. The device of any of clauses 1-2, in which the first BEOL interconnect trace is coupled to one side of the first plate of the main capacitor through the first BEOL sideline traces.

4. The device of any of clauses 1-3, further comprising: a second tuning capacitor comprising a second portion of the first BEOL interconnect trace, a second insulator layer on a surface and sidewalls of the second portion of the first BEOL interconnect trace, and a third BEOL interconnect trace on a surface and sidewalls of the second insulator layer; and a second via capture pad coupled to the third BEOL interconnect trace of the second tuning capacitor.

5. The device of clause 4, in which a width of the third BEOL interconnect trace of the second tuning capacitor is greater than a width of the second BEOL interconnect trace of the first tuning capacitor.

6. The device of any of clauses 4-5, in which a width of the second portion of the first BEOL interconnect trace of the second tuning capacitor is greater than a width of the first portion of the first BEOL interconnect trace of the first tuning capacitor.

7. The device of any of clauses 4-6, further comprising: a first via coupled to the second plate of the main capacitor; a second via coupled to the second via capture pad; and a third BEOL metallization layer on the first via and the second via.

8. The device of any of clauses 1-6, further comprising: a first via coupled to the second plate of the main capacitor; a second via coupled to the first via capture pad; and a third BEOL metallization layer on the first via and the second via.

9. The device of any of clauses 1-8, in which a first width of the first insulator layer is greater than a width of the first portion of the first BEOL interconnect trace of the first tuning capacitor, and a second width of the first insulator layer is greater than a width of the second BEOL interconnect trace of the first tuning capacitor.

10. The device of any of clauses 1-9, in which the device comprises an integrated circuit (IC).

11. The device of any of clauses 1-9, in which the device comprises an integrated passive device (IPD).

12. The device of clause 11, in which the IPD comprises a radio frequency (RF) filter.

13. The device of any of clauses 11-12, in which the IPD is integrated in a radio frequency (RF) module.

14. A method for fabricating a main capacitor coupled to tuning capacitors, comprising: forming a first plate of the main capacitor composed of a first back-end-of-line (BEOL) metallization layer; depositing a first BEOL interconnect trace coupled to the first plate of the main capacitor through first BEOL sideline traces to form first plates of the tuning capacitors; depositing an insulator layer on the first plate of the main capacitor and the first plates of the tuning capacitors; depositing a second BEOL metallization layer on the insulator layer to form a second plate of the main capacitor and second BEOL interconnect traces on the insulator layer to form second plates of the tuning capacitors; and forming first vias coupled to the second plate of the main capacitor and second vias coupled to via capture pads coupled to the second BEOL interconnect traces.

15. The method of clause 14, in which the tuning capacitors comprise: a first tuning capacitor comprising a first portion of the first BEOL interconnect trace, a first insulator layer on a surface and sidewalls of the first portion of the first BEOL interconnect trace, and a second BEOL interconnect trace on a surface and sidewalls of the first insulator layer; a first via capture pad coupled to the second BEOL interconnect trace of the first tuning capacitor; a second tuning capacitor comprising a second portion of the first BEOL interconnect trace, a second insulator layer on a surface and sidewalls of the second portion of the first BEOL interconnect trace, and a third BEOL interconnect trace on a surface and sidewalls of the second insulator layer; and a second via capture pad coupled to the third BEOL interconnect trace of the second tuning capacitor.

16. The method of clause 15, in which a width of the third BEOL interconnect trace of the second tuning capacitor is greater than a width of the second BEOL interconnect trace of the first tuning capacitor.

17. The method of any of clauses 15-16, in which a width of the second portion of the first BEOL interconnect trace of the second tuning capacitor is greater than a width of the first portion of the first BEOL interconnect trace of the first tuning capacitor.

18. The method of any of clauses 15-17, further comprising: forming a first via coupled to the second plate of the main capacitor; forming a second via coupled to the first via capture pad; and forming a third BEOL metallization layer on the first via and the second via.

19. The method of any of clauses 15-17, further comprising: forming a first via coupled to the second plate of the main capacitor; forming a second via coupled to the second via capture pad; and forming a third BEOL metallization layer on the first via and the second via.

20. The method of any of clauses 15-19, in which a first width of the first insulator layer is greater than a width of the first portion of the first BEOL interconnect trace of the first tuning capacitor, and a second width of the first insulator layer is greater than a width of the second BEOL interconnect trace of the first tuning capacitor.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. A device, comprising:
    a main capacitor comprising a first plate composed of a first back-end-of-line (BEOL) metallization layer, a main insulator layer on the first plate, and a second plate on the main insulator layer and composed of a second BEOL metallization layer;
    a first tuning capacitor comprising a first portion of a first BEOL interconnect trace coupled to the first plate of the main capacitor through first BEOL sideline traces, each of which extends perpendicular to the first portion of the first BEOL interconnect trace, a first insulator layer on a surface and sidewalls of the first portion of the first BEOL interconnect trace, and a second BEOL interconnect trace on a surface and sidewalls of the first insulator layer; and
    a first via capture pad coupled to the second BEOL interconnect trace of the first tuning capacitor.

2. The device of claim 1, in which the first BEOL interconnect trace is orthogonal to the second BEOL interconnect trace.

3. The device of claim 1, in which the first BEOL interconnect trace is coupled to one side of the first plate of the main capacitor through the first BEOL sideline traces.

4. The device of claim 1, further comprising:
    a second tuning capacitor comprising a second portion of the first BEOL interconnect trace, a second insulator layer on a surface and sidewalls of the second portion of the first BEOL interconnect trace, and a third BEOL interconnect trace on a surface and sidewalls of the second insulator layer; and
    a second via capture pad coupled to the third BEOL interconnect trace of the second tuning capacitor.

5. The device of claim 4, in which a width of the third BEOL interconnect trace of the second tuning capacitor is greater than a width of the second BEOL interconnect trace of the first tuning capacitor.

6. The device of claim 4, in which a width of the second portion of the first BEOL interconnect trace of the second tuning capacitor is greater than a width of the first portion of the first BEOL interconnect trace of the first tuning capacitor.

7. The device of claim 4, further comprising:
    a first via coupled to the second plate of the main capacitor;
    a second via coupled to the second via capture pad; and
    a third BEOL metallization layer on the first via and the second via.

8. The device of claim 1, further comprising:
    a first via coupled to the second plate of the main capacitor;
    a second via coupled to the first via capture pad; and
    a third BEOL metallization layer on the first via and the second via.

9. The device of claim 1, in which a first width of the first insulator layer is greater than a width of the first portion of the first BEOL interconnect trace of the first tuning capacitor, and a second width of the first insulator layer is greater than a width of the second BEOL interconnect trace of the first tuning capacitor.

10. The device of claim 1, in which the device comprises an integrated circuit (IC).

11. The device of claim 1, in which the device comprises an integrated passive device (IPD).

12. The device of claim 11, in which the integrated passive device (IPD) comprises a radio frequency (RF) filter.

13. The device of claim 11, in which the IPD is integrated in a radio frequency (RF) module.

14. A method for fabricating a main capacitor coupled to tuning capacitors, comprising:
    forming a first plate of the main capacitor composed of a first back-end-of-line (BEOL) metallization layer;
    depositing a first BEOL interconnect trace to form first plates of the tuning capacitors coupled to the first plate of the main capacitor through first BEOL sideline traces, each of which extends perpendicular to the first plates of the tuning capacitors;
    depositing an insulator layer on the first plate of the main capacitor and the first plates of the tuning capacitors;
    depositing a second BEOL metallization layer on the insulator layer to form a second plate of the main capacitor and second BEOL interconnect traces on the insulator layer to form second plates of the tuning capacitors; and
    forming first vias coupled to the second plate of the main capacitor, and forming second vias coupled to via capture pads of the tuning capacitors which are coupled to the second BEOL interconnect traces.

15. The method of claim 14, in which the tuning capacitors comprise:
    a first tuning capacitor comprising a first portion of the first BEOL interconnect trace, a first insulator layer on a surface and sidewalls of the first portion of the first BEOL interconnect trace, and a second BEOL interconnect trace on a surface and sidewalls of the first insulator layer;
    a first via capture pad coupled to the second BEOL interconnect trace of the first tuning capacitor;
    a second tuning capacitor comprising a second portion of the first BEOL interconnect trace, a second insulator layer on a surface and sidewalls of the second portion of the first BEOL interconnect trace, and a third BEOL interconnect trace on a surface and sidewalls of the second insulator layer; and
    a second via capture pad coupled to the third BEOL interconnect trace of the second tuning capacitor.

16. The method of claim 15, in which a width of the third BEOL interconnect trace of the second tuning capacitor is greater than a width of the second BEOL interconnect trace of the first tuning capacitor.

17. The method of claim 15, in which a width of the second portion of the first BEOL interconnect trace of the second tuning capacitor is greater than a width of the first portion of the first BEOL interconnect trace of the first tuning capacitor.

18. The method of claim 15, further comprising:
forming one of the second vias coupled to the first via capture pad; and
forming a third BEOL metallization layer on the first vias and the one of the second vias.

19. The method of claim 15, further comprising:
forming one of the second vias coupled to the second via capture pad; and
forming a third BEOL metallization layer on the first vias and the one of the second via.

20. The method of claim 15, in which a first width of the first insulator layer is greater than a width of the first portion of the first BEOL interconnect trace of the first tuning capacitor, and a second width of the first insulator layer is greater than a width of the second BEOL interconnect trace of the first tuning capacitor.

* * * * *